(12) United States Patent
Huang et al.

(10) Patent No.: US 11,548,405 B2
(45) Date of Patent: Jan. 10, 2023

(54) CURRENT MODULATION MODULE, PARAMETER DETERMINATION MODULE, BATTERY HEATING SYSTEM, AS WELL AS CONTROL METHOD AND CONTROL DEVICE THEREOF

(71) Applicant: Jiangsu Contemporary Amperex Technology Limited, Jiangsu (CN)

(72) Inventors: Xiaojian Huang, Jiangsu (CN); Zhimin Dan, Jiangsu (CN); Bao Li, Jiangsu (CN); Xiyang Zuo, Jiangsu (CN)

(73) Assignee: Jiangsu Contemporary Amperex Technology Limited, Changzhou (CN)

( * ) Notice: Subject to any disclaimer, the term of this patent is extended or adjusted under 35 U.S.C. 154(b) by 0 days.

(21) Appl. No.: 17/486,960

(22) Filed: Sep. 28, 2021

(65) Prior Publication Data

US 2022/0169147 A1    Jun. 2, 2022

Related U.S. Application Data

(63) Continuation of application No. PCT/CN2021/081158, filed on Mar. 16, 2021.

(30) Foreign Application Priority Data

Nov. 30, 2020  (CN) .......................... 202011374089.X (51) Int. Cl.
*B60L 58/12* (2019.01)
*H01M 10/615* (2014.01)
(Continued)

(52) U.S. Cl.
CPC ............... *B60L 58/12* (2019.02); *B60L 50/51* (2019.02); *G01R 31/382* (2019.01);
(Continued)

(58) Field of Classification Search
CPC ...... B60L 58/12; B60L 50/51; B60L 2210/40; B60L 2220/40; G01R 31/382; H01M 10/615; H01M 10/625; H01M 10/63
See application file for complete search history.

(56) References Cited

U.S. PATENT DOCUMENTS

| 6,051,951 A | * | 4/2000 | Arai ......................... H02P 9/30 |
| | | | 903/906 |
| 2008/0072619 A1 | * | 3/2008 | Nojima ................. F25B 49/025 |
| | | | 62/498 |

(Continued)

FOREIGN PATENT DOCUMENTS

| CN | 103560304 B | 5/2016 |
| CN | 105762434 A | 7/2016 |

(Continued)

OTHER PUBLICATIONS

The International search report for PCT Application No. PCT/CN2021/081158, dated Jul. 26, 2021, 12 pages.

(Continued)

*Primary Examiner* — Daniel Kessie
*Assistant Examiner* — Brian K Baxter
(74) *Attorney, Agent, or Firm* — East IP P.C.

(57) ABSTRACT

The embodiments of the present application provide a current modulation module, a parameter determination module, a battery heating system, as well as a control method and a control device thereof, and relate to the field of battery. The control method includes determining a state of charge (SOC), of the battery, modulating a first current flowing into windings of a motor into an alternating current when the SOC is greater than a first SOC threshold, so as to use heat generated by the alternating current in a first target module to heat the battery, and modulating a second current flowing into the windings of the motor into a direct current when the (Continued)

SOC is less than or equal to the first SOC threshold, so as to use heat generated by the direct current in a second target module to heat the battery.

14 Claims, 4 Drawing Sheets (51) Int. Cl.
    *H01M 10/63*     (2014.01)
    *B60L 50/51*     (2019.01)
    *G01R 31/382*     (2019.01)
    *H01M 10/625*     (2014.01)

(52) U.S. Cl.
    CPC ....... *H01M 10/615* (2015.04); *H01M 10/625* (2015.04); *H01M 10/63* (2015.04); *B60L 2210/40* (2013.01); *B60L 2220/40* (2013.01)

(56) References Cited

U.S. PATENT DOCUMENTS

| | | | | |
|---|---|---|---|---|
| 2012/0280660 A1* | 11/2012 | Aga | ...................... | H01M 10/63 320/134 |
| 2012/0306432 A1 | 12/2012 | Xu et al. | | |
| 2015/0295514 A1* | 10/2015 | Yamagami | .............. | B60L 58/12 363/98 |
| 2018/0115180 A1* | 4/2018 | Shin | .......................... | H02J 3/18 |
| 2019/0176930 A1* | 6/2019 | Wiegel | .................... | B62M 6/50 |
| 2020/0207237 A1 | 7/2020 | Zuo et al. | | |
| 2020/0324664 A1* | 10/2020 | Kanzaki | .................. | B60L 58/12 |
| 2021/0336472 A1* | 10/2021 | Bae | ......................... | B60L 53/11 |

FOREIGN PATENT DOCUMENTS

| | | |
|---|---|---|
| CN | 105932363 A | 9/2016 |
| CN | 108501746 A | 9/2018 |
| CN | 109301397 A | 2/2019 |
| CN | 111002861 A | 4/2020 |
| CN | 111048860 A | 4/2020 |
| CN | 111137149 A | 5/2020 |
| CN | 111347853 A | 6/2020 |
| CN | 111347893 A | 6/2020 |
| CN | 111347935 A | 6/2020 |
| CN | 111347939 A | 6/2020 |
| CN | 111355001 A | 6/2020 |
| CN | 112186308 A | 1/2021 |
| JP | 2007012568 A | 1/2007 |

OTHER PUBLICATIONS

The First Office Action for China Application No. 202011374089.X, dated Jan. 11, 2021, 11 pages.
The notification to grant for CN Application No. 202110229806.8, dated Jan. 26, 2022, 7 pages.
The extended European search report for EP Application No. 21755673.7, dated Jun. 14, 2022, 9 pages.
Ahmad Pesaran et al: "Cooling and Preheating of Batteries in Hybrid Electric Vehicles", dated Jan. 1, 2003, 7 pages.

* cited by examiner

CURRENT MODULATION MODULE, PARAMETER DETERMINATION MODULE, BATTERY HEATING SYSTEM, AS WELL AS CONTROL METHOD AND CONTROL DEVICE THEREOF

CROSS-REFERENCE TO RELATED APPLICATIONS

The application is a continuation of International Application No. PCT/CN2021/081158 filed on Mar. 16, 2021, which claims a priority of the Chinese patent application No. 202011374089.X, filed on Nov. 30, 2020 and entitled by "Battery Heating System, and Control Method and Device thereof", both of which are incorporated herein by reference in its entirety.

TECHNICAL FIELD

The application relates to the field of battery, in particular to a current modulation module, a parameter determination module, a battery heating system, as well as a control method and a control device thereof.

BACKGROUND

With development of new energy, more and more fields use new energy as power. Due to advantages of high energy density, rechargeability, safety and environmental protection property, batteries have been used in a wide range of fields such as new energy vehicles, consumer electronics and energy storage systems.

However, usage of a battery in a low temperature environment would be subject to certain restrictions. Specifically, discharge capacity of the battery in the low temperature environment would be severely degraded, and the battery cannot be charged in the low temperature environment. Therefore, in order to enable a normal use of the battery, it is necessary to heat the battery in the low temperature environment.

However, in existing solutions for the heating, an external heating device is required to heat the battery, and the heating is performed in a singular way during an entire heating process, and thus flexibility of the heating is lower.

SUMMARY

The current modulation module, battery management system (BMS), battery heating system, as well as control method and control device thereof according to embodiments of the present application can take both heating efficiency and energy consumption into account, and can improve flexibility of the battery heating system.

In a first aspect, the embodiments of the present application provide a control method of a battery heating system, the battery heating system including windings of a motor, wherein the method is applied in a current modulation module and includes:

receiving a target modulation signal sent by a parameter determination module, wherein the target modulation signal is either a first modulation signal or a second modulation signal, wherein the first modulation signal is sent by the parameter determination module when a state of charge, SOC, of a battery is greater than a first SOC threshold, and the second modulation signal is sent by the parameter determination module when the SOC is less than or equal to the first SOC threshold;

modulating a first current flowing into the windings of the motor into an alternating current in the case that the target modulation signal is the first modulation signal, so as to use heat generated by the alternating current in a first target module to heat the battery; and modulating a second current flowing into the windings of the motor into a direct current in the case that the target modulation signal is the second modulation signal, so as to use heat generated by the direct current in a second target module to heat the battery.

In a second aspect, the embodiments of the present application provide a control method of a battery heating system, the battery heating system including windings of a motor, wherein the control method is applied to a parameter determination module and includes:

determining a state of charge, SOC, of a battery;

sending a first modulation signal to a current modulation module when the SOC is greater than a first SOC threshold, wherein the first modulation signal is used to control the current modulation module to modulate a first current flowing into the windings of the motor into an alternating current, so as to use heat generated by the alternating current in a first target module to heat the battery; and sending a second modulation signal to the current modulation module when the SOC is less than or equal to the first SOC threshold, wherein the second modulation signal is used to control the current modulation module to modulate a second current flowing into the windings of the motor into a direct current, so as to use heat generated by the direct current in a second target module to heat the battery.

In a third aspect, the embodiments of the present application provide a control device of a battery heating system, the battery heating system including windings of a motor, wherein the control device includes: a parameter acquisition module configured to determine a state of charge, SOC, of a battery; and a current modulation module configured to modulate a first current flowing into the windings of the motor into an alternating current when the SOC is greater than a first SOC threshold, so as to use heat generated by the alternating current in a first target module to heat the battery; and modulate a second current flowing into the windings of the motor into a direct current when the SOC is less than or equal to the first SOC threshold, so as to use heat generated by the direct current in a second target module to heat the battery.

In a fourth aspect, there is provided a current modulation module including:

a receiving unit configured to receive a target modulation signal sent by a parameter determination module, wherein the target modulation signal is either a first modulation signal or a second modulation signal, wherein the first modulation signal is sent by the parameter determination module when a state of charge, SOC, of a battery is greater than a first SOC threshold, and the second modulation signal is sent by the parameter determination module when the SOC is less than or equal to the first SOC threshold;

a first modulation unit configured to modulate a first current flowing into the windings of the motor into an alternating current in the case that the target modulation signal is the first modulation signal, so as to use heat generated by the alternating current in a first target module to heat the battery; and a second modulation unit configured to modulate a second current flowing into the windings of the motor into a direct current in the case that the target modulation signal is the second modulation signal, so as to use heat generated by the direct current in a second target module to heat the battery.

In a fifth aspect, there is provided a parameter determination module including:

a parameter determination unit configured to determine a state of charge, SOC, of a battery;

a first signal sending unit configured to send a first modulation signal to the current modulation module when the SOC is greater than a first SOC threshold, wherein the first modulation signal is used to control the current modulation module to modulate a first current flowing into the windings of the motor into an alternating current, so as to use heat generated by the alternating current in a first target module to heat the battery; and a second signal sending unit configured to send a second modulation signal to the current modulation module when the SOC is less than or equal to the first SOC threshold, wherein the second modulation signal is used to control the current modulation module to modulate a second current flowing into the windings of the motor into a direct current, so as to use heat generated by the direct current in a second target module to heat the battery.

In a sixth aspect, there is provided a battery heating system including: windings of a motor; and the control device according to the third aspect or any one of embodiments of the third aspect.

Since heating of a battery by heat generated from an alternating current has a higher heating efficiency and energy consumption than heating of the battery by heat generated from a direct current, in the current modulation module, the BMS, the battery heating system, as well as the control method and the control device thereof according to the embodiments of the present application, a direct current is used to generate heat at a first target module to heat the battery when a SOC of the battery is less than or equals to a first SOC threshold, that is, when power of the battery power is insufficient, which reduces power consumption; and an alternating power is used to generate heat at a second target module to heat the battery when the SOC is greater than the first SOC threshold, that is, when the power of the battery is sufficient, which improves heating efficiency, and thereby both the heating efficiency and the energy consumption are taken in to considered entirely, and flexibility of the battery heating system can be improved.

BRIEF DESCRIPTION OF THE DRAWINGS

In order to more clearly illustrate technical solutions of the embodiments of the present application, drawings required to be used in the embodiments of the present application will be briefly introduced below. Apparently, the drawings described below refer to only some embodiments of the present application. For those skilled in the art, other drawings can be obtained based on the drawings herein without inventive efforts.

In the drawings, the figures are not drawn according to an actual scale.

DETAILED DESCRIPTION

The implementations of the present application will be described below in further detail with reference to the accompanying drawings and embodiments. The following detailed description and the drawings of the embodiments are used to exemplarily illustrate principle of the present application, but not to limit scope of the present application, that is, the present application is not limited to the described embodiments.

In the description of the present application, it should be noted that, unless otherwise stated, "a plurality of" means two or more; an orientation or location relationship indicated by terms "upper", "lower", "left", "right", "inside" and "outside" or the like is used only for conveniently describing the application and simplifying the description, rather than indicating or implying that the involved devices or elements must have a specific orientation, must be constructed or operated in a specific orientation, and therefore cannot be construed as a limitation of the application. Further, terms "first", "second", "third" or the like are used only for descriptive purposes, and should not be construed to indicate or imply relative importance. The word "vertical" does not indicate vertical to a strict extent, but allow a certain range of errors. The word "parallel" does not indicate parallel to a strict extent, but allow a certain range of errors.

All of the terms about orientations appearing in the following description indicate directions shown in the figures, and do not limit specific structures in the present application. In the description of the present application, it should also be noted that, unless otherwise clearly defined and stated, terms "install", "connect" and "connection" should be construed in a broad sense, for example, it may be a fixed connection, or a removable connection, or an integral connection; and it may be a direct connection, or an indirect connection through an intermediate medium. For those skilled in the art, specific meaning of the above-mentioned terms in the present application should be construed according to specific circumstances.

The embodiments of the present application provide a battery heating system as well as a control method and a control device thereof, which can be applied in a scenario where a battery with a lower temperature is heated. For example, it can be applied in a particular scenario where heating of a battery is performed such that temperature of the battery rises to reach a temperature at which the battery can be used normally. Specifically, in the embodiments of the present application, when a state of charge (State Of Charge, SOC) of the battery is greater than a first SOC threshold, a current in the windings can be modulated to an alternating current, which is used to generate heat at a first target module to heat the battery, thereby improving heating efficiency; and when the SOC of the battery is less than or equals to the first SOC threshold, that is, when power of the battery is insufficient, a direct current is used to generate heat at a second target module to heat the battery, thereby reducing power consumption, and thus flexibility of the battery heating system can be improved.

Firstly, in order for better understanding of the present application, concepts such as SOC, battery and battery power system will be explained specifically in the embodiments of the present application.

(1) SOC, that is, a ratio of remaining power of a battery with a certain discharge rate with respect to rated capacity of the battery under the same condition.

SOC is one of important parameters of a battery management system, and also provides a basis for charge or discharge control strategies of an entire vehicle and balancing operation of batteries. However, due to complexity of a structure of a lithium battery, its state of charge cannot be obtained by an immediate measurement. It can only be estimated by using a relevant characteristic curve or a calculation formula based on some external characteristics of the battery, such as the battery's internal resistance, temperature, current and other related parameters.

(2) Battery: the battery in the embodiments of the present application may be, but not limited to, a lithium ion battery, a lithium metal battery, a lead-acid battery, a nickel barrier battery, a nickel hydrogen battery, a lithium sulfur battery, a lithium air battery, or a sodium ion battery, etc.. In terms of scale, the battery in the embodiments of the present application may be, but not limited to, a battery cell, a battery module or a battery pack. In terms of application scenarios, the battery may be used in a power device such as an automobile and a ship. For example, the battery can be used in an electric vehicle to supply power to a motor of the electric vehicle as a power source of the electric vehicle. The battery may also provide power for other electrical devices in the electric vehicle such as an air conditioner or a player in the vehicle.

(3) Battery power system, through which electric energy provided by a battery can be converted into mechanical energy when the battery is used as a power source of a power device.

Figure 1:
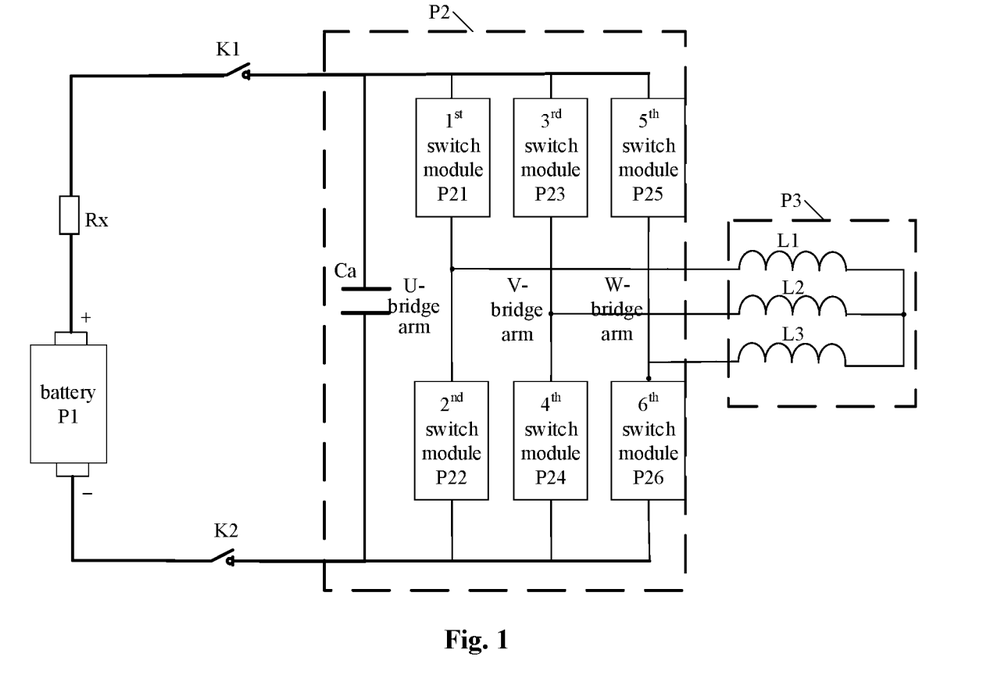
FIG. 1 is a system architecture diagram of an exemplary battery power system according to an embodiment of the present application.

FIG. 1 is a system architecture diagram of an exemplary battery power system according to an embodiment of the present application.

As shown in FIG. 1, the battery power system may include: an inverter P2 connected to the battery P1, and a motor P3 connected to the inverter P2.

Regarding the inverter P2, specific description thereof is provided as follows.

The inverter P2 includes three phases of bridge arms: a U-phase bridge arm, a V-phase bridge arm, and a W-phase bridge arm. Each of the above-mentioned three phases of bridge arms has an upper bridge arm and a lower bridge arm, and the upper bridge arm and the lower bridge arm are respectively provided with a switch module.

For example, as shown in FIG. 1, the switch module of the upper bridge arm of the U-phase bridge arm is the first switch module P21, and the switch module of the lower bridge arm of the U-phase bridge arm is the second switch module P22. The switch module of the upper bridge arm of the V-phase bridge arm is the third switch module P23, and the switch module of the lower bridge arm of the V-phase bridge arm is the fourth switch module P24. The switch module of the upper bridge arm of the W-phase bridge arm is the fifth switch module P25, and the switch module of the lower bridge arm of the W-phase bridge arm is the sixth switch module P26.

Regarding the motor P3, specific description thereof is provided as follows.

As shown in FIG. 1, windings of the motor P3 may specifically include: a U-phase winding L1, a V-phase winding L2, and a W-phase winding L3.

One terminal of the U-phase winding L1 is connected to a connection point of the upper bridge arm and the lower bridge arm of the U-phase bridge arm. One terminal of the V-phase winding L2 is connected to a connection point of the upper bridge arm and the lower bridge arm of the V-phase bridge arm. One terminal of the W-phase winding L3 is connected to a connection point of the upper bridge arm and the lower bridge arm of the W-phase bridge arm.

The other terminal of the U-phase winding L1, the other terminal of the V-phase winding L2, and the other terminal of the W-phase winding L3 are connected with each other.

Secondly, after description of the above concepts, the following parts will specifically describe a battery heating system in the embodiments of the present application. It should be noted that the battery heating system provided in the embodiments of the present application is implemented in an initial power system and various management systems involving a battery, and there is no need to separately set up a separate heating device.

Figure 2:
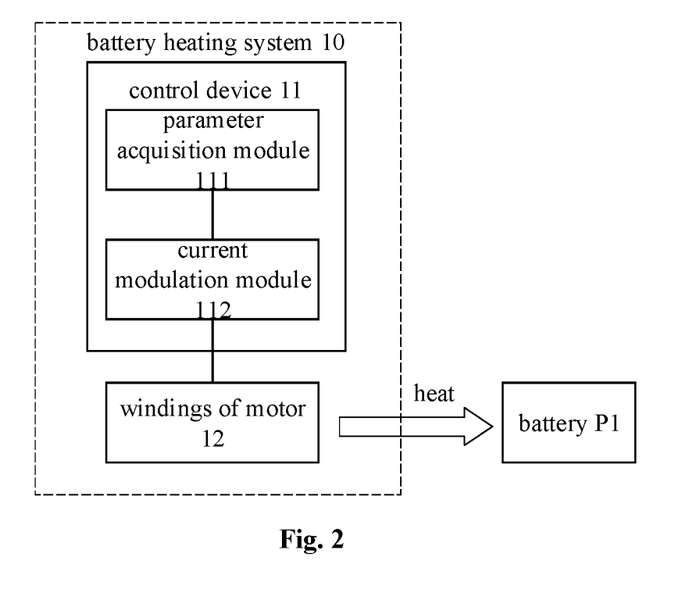
FIG. 2 is a system architecture diagram of a battery heating system according to an embodiment of the present application.

FIG. 2 is a system architecture diagram of a battery heating system according to an embodiment of the present application.

As shown in FIG. 2, the battery heating system 10 may include: a control device 11 and motor windings 12.

Firstly, regarding the motor windings 12, the motor windings 12 may include: the U-phase winding L1, the V-phase winding L2, and the W-phase winding L3 as shown in FIG. 1.

Secondly, regarding the control device 11, the control device 11 may include a parameter acquisition module 111 and a current modulation module 112. In an embodiment, a communication connection is established between the parameter acquisition module 111 and the current modulation module 112, which may be, but not limited to, a wired connection or a wireless connection.

Regarding the parameter acquisition module 111, it can determine a SOC of a battery. In some embodiments, a real-time SOC of the battery can be estimated using methods such as a discharge experiment method, an ampere-hour integration method, a Kalman filtering method, and a neural network method. In an example, the parameter acquisition module 111 may be specifically implemented as a module having a SOC calculation function, such as a battery management system (Battery Management System, BMS).

In addition, the BMS can also determine a magnitude relationship between the SON of the battery and a first SOC threshold, and send, when it is determined that the SON of the battery is greater than the first SOC threshold, a first modulation signal to the current modulation module 112 to control the current modulation module 112 to modulate a current flowing into the motor windings 12 into a direct current in response to the first modulation signal, and send, when it is determined that the SON of the battery is less than or equals to the first SOC threshold, a second modulation signal to the current modulation module 112 to control the current modulation module 112 to modulate the current flowing into the motor windings 12 into an alternating current in response to the second modulation signal.

Regarding the current modulation module 112, it can modulate the current of the motor windings 12, so that heat generated by the current is transferred to the battery P1. Specifically, when the SON of the battery is less than the first SOC threshold, the current modulation module 112 may modulate the current flowing into the motor windings 12 into a direct current. After the current flowing into the motor windings 12 is modulated into the direct current, the direct current, when flowing through a second target module, can generate heat at the second target module for heating the battery P1. In one embodiment, the second target module is a device or module arranged on a line between the battery heating system and the battery P1, and the second target module generates heat when the direct current flows through the second target module. Exemplarily, the second target module includes: the battery P1 and/or the motor windings 12. When the SOC of the battery is greater than the first SOC threshold, the current modulation module 112 may modulate the current flowing into the motor windings 12 into an alternating current. After the current flowing into the motor windings 12 is modulated into the alternating current, the alternating current, when flowing through the first target module, can generate heat at the first target module for heating the battery P1. In one embodiment, the first target module is a device or module arranged on a line between the battery heating system and the battery P1, and the first target module generates heat when the alternating current flows through the first target module. Exemplarily, the first target module includes: the battery P1 and/or the motor windings 12. The first SOC threshold may be, but not limited to, set according to specific scenarios and actual requirements.

In an example, the current modulation module 112 may be specifically implemented as a motor controller. Specifically, the motor controller can output a driving signal to an upper bridge-arm switch module and a lower bridge-arm switch module to control the upper bridge-arm switch module and the lower bridge-arm switch module to be turned on and off periodically.

The driving signal may specifically be a pulse signal. Further, the driving signal may be a pulse width modulation (Pulse Width Modulation, PWM) signal. For example, a high level signal in the drive signal can drive a switch module to be turned on, and a low level signal in the drive signal can drive the switch module to be turned off. The driving signal can control a target upper bridge-arm switch module and a target lower bridge-arm switch module to be turned on and off periodically. It should be noted that the switch modules that are not driven by the drive signal are all turned off.

In some embodiments, when a preset heating condition is met, the BMS decides to enter a battery heating mode, and after it is decided to enter the battery heating mode, determines a SOC of the battery, and determines a modulation signal according to a magnitude relationship between the SOC of the battery and a first SOC threshold.

In an example, the preset heating condition may include: a temperature parameter of the battery P1 is less than a preset heating temperature threshold. The preset heating temperature threshold, that is, a temperature limit for the battery heating system entering the heating mode, is specifically embodied as a minimum required temperature at which the battery P1 can work normally. The heating temperature threshold may be, but not limited to, set according to work scenarios and work requirements.

In another example, for a battery installed in a power device, the corresponding preset heating condition may further include: the power device is in a stopped state. Particularly, it can be determined that the power device is in a stopped state when the inverter P2 and the motor P3 are both in a non-operation state.

In some embodiments, the battery heating system 10 may further include an energy transmission module (not shown in the figures). The energy transmission module can absorb heat generated by the motor windings 12 and transfer the heat to the battery P1.

Figure 3:
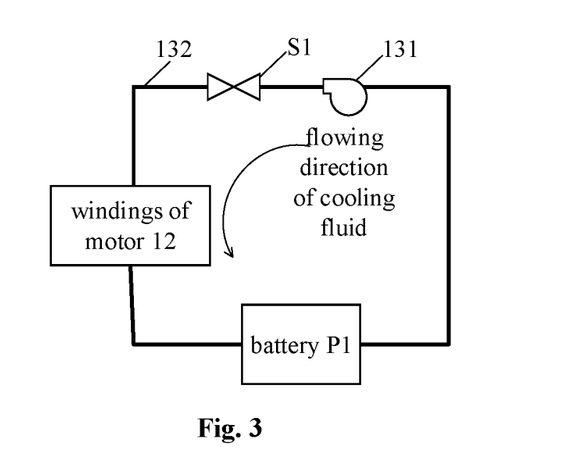
FIG. 3 is a schematic structural diagram of an energy transmission module according to an embodiment of the present application.

FIG. 3 is a schematic structural diagram of an energy transmission module according to an embodiment of the present application. As shown in FIG. 3, the energy transmission module may include an on-off valve S1, a first pump 131 and a cooling pipe 132.

The on-off valve S1 is used to control on-off of the cooling pipe 132. When the switch valve S1 is turned on, a cooling liquid in the cooling pipe 132 can flow through the on-off valve. When the on-off valve S1 is turned off, the on-off valve S1 can shut off the cooling liquid in the cooling pipe 132.

The first pump 131 can control a flow direction of the cooling liquid. When the first pump 131 is working, the cooling liquid can flow in a direction as indicated by an arrow shown in FIG. 3.

Correspondingly, in the embodiments of the present application, the first pump 131 can be controlled to be opened, and the on-off valve S1 can be controlled to be turned on, and then the cooling liquid in the pipe can flow through the motor windings 12 and the battery P1 in that order. When the cooling liquid flows through the motor windings 12, it can absorb heat from the motor windings 12. Then, the cooling liquid flows through the battery P1, and can release the heat absorbed from the motor windings 12 to the battery P1, thereby heating the battery P1.

Figure 4:
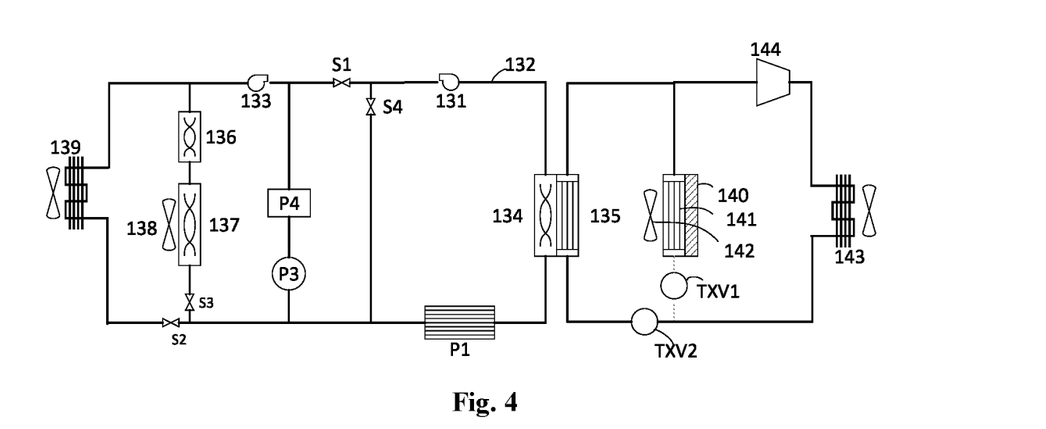
FIG. 4 is a schematic structural diagram of an exemplary energy transmission module according to an embodiment of the present application.

In an example, FIG. 4 is a schematic structural diagram of an exemplary energy transmission module according to an embodiment of the present application.

As shown in FIG. 4, the energy transmission module may include: on-off valves S1-S4, a first pump 131, a cooling pipe 132, a second pump 133, a cooling system heat exchanger 134, a cooling system evaporator 135, and a seat heat exchanger 136, a cabin heat exchanger 137, a cabin heat exchanging fan 138, a radiator 139, a cabin heater 140, a cabin refrigeration evaporator 141, a cabin heat exchanging fan 142, a radiator 143, and a compressor 144.

The energy transmission module specifically includes the following three operation states.

(1) When the vehicle is in a parking condition and the battery is to be heated, the on-off valve S1 is turned on, the on-off valves S2 to S4 are turned off, the first pump 131 is started, the second pump 133 is stopped, and the radiator 139 is stopped. In such case, the heat absorbed by the cooling fluid is used to heat the battery P1, the busbar current is very small, and the heat of the cooling fluid comes from the heat generated by the motor windings.

(2) When the vehicle is in a parking condition and both the battery and the cabin are to be heated, the heat of the motor windings L1-L3 heats the battery first, and then heats the cabin and/or seats depending on an actual situation. Specifically, in a first stage, the on-off valve S1 is turned on, the on-off valves S2 to S4 are turned off, the first pump 131 is started, the second pump 133 is stopped, and the radiator 139 is stopped. In such case, the heat absorbed by the cooling liquid from the motor P3 is used to heat the battery P1. In a second stage, after the battery reaches a specified temperature, the second pump 133 is started, an opening degree of the on-off valve S1 and the on-off valve S3 are adjusted, the cabin and/or seats are heated while maintaining the temperature of the battery.

(3) When the vehicle is in a driving condition and the motor is already in a normal operation mode, the heat of the motor windings L1-L3 is used to heat the cabin. In such case, the on-off valve S2 is turned on, the on-off valve S2 is turned off or its opening degree is adjusted, the on-off valve S3 is turned off, the first pump 131 is turned off, and the second pump 133 is started, so that the heat absorbed by the cooling fluid from the motor P3 is used to heat the cabin and/or seats. Particularly, an operation state of the cabin heat exchanger 137 can be determined depending on heating requirements.

(4) When the vehicle is in a driving condition and the motor is already in a normal operation mode, the heat of the motor windings L1-L3 is used to maintain the heating of the battery. In such case, the on-off valves S2 to S4 are turned off, the on-off valve S1 is turned on, the first pump 131 is started, the second pump 133 is stopped, and the radiator is stopped. The heat absorbed by the cooling liquid from the motor P3 in such case is used to heat the battery P1.

It should be noted that, in order to improve heating efficiency, the cooling fluid in the embodiments of the present application not only can absorb heat from the motor P3, but also can also absorb energy from an electronic control unit P4.

Figure 5:
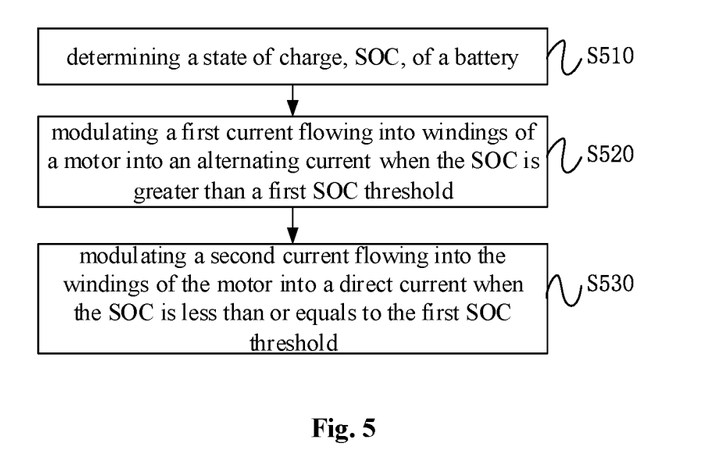
FIG. 5 is a schematic flow chart of a control method of a battery heating system according to an embodiment of the present application.

After a preliminary understanding of the battery heating system according to the embodiments of the present application, the embodiments of the present application will describe in detail the control method of the battery heating system according to the embodiments of the present application with reference to FIG. 5. FIG. 5 is a schematic flowchart of a control method of a battery heating system according to an embodiment of the present application. As shown in FIG. 5, the control method 500 of the battery heating system may specifically include S510 to S530.

At S510: a SOC of a battery is determined.

Regarding details about the SOC of the battery, relevant description in the foregoing parts of the embodiments of the present application may be referenced, and will not be repeated here.

In some embodiments, an execution subject of S510 may be a BMS. For details about of the BMS, relevant description in the foregoing parts of the embodiments of the present application may be referenced, and will not be repeated here.

At S520, when the SOC is greater than a first SOC threshold, a first current flowing into the motor windings is modulated into an alternating current, so as to use heat generated by the alternating current at a first target module to heat the battery.

In some embodiments, a control signal for the switches at respective bridge arms in the inverter may be generated by a space vector control method (Space Vector Pulse Width Modulation, SVPWM), and used to control on and off of the switches at respective bridge arms so as to modulate the current flowing into the motor windings into the alternating current. Exemplarily, a direct-axis current component of the current in the windings may be controlled to be an alternating current, and a quadrature-axis current component of the current in the windings may be controlled to be 0, so as to modulate the current in the windings to the alternating current.

In addition, regarding details about the first SOC threshold, it may be obtained by reference to those relevant description in the above-mentioned embodiments of the present application, and will not be repeated here. The first SOC threshold may be, but not limited to, set according to specific scenarios and actual requirements. In an example, the first SOC threshold may be a value ranging from 15% to 30%.

In some embodiments, the modulation into the alternating current may be implemented by controlling a target upper bridge-arm switch and a target lower bridge-arm switch in the inverter to be periodically turned on and off. In an example, regarding details of the particular method for modulating into the alternating current, FIG. 1 can be continuously referenced. In the case that the target upper bridge-arm switch module is the first switch module P21, the target lower bridge-arm switch module is the fourth switch module P24 and/or the sixth switch module P26. In the case that the target upper bridge-arm switch module is the third switch module P23, the target lower bridge-arm switch module is the second switch module P22 and/or the sixth switch module P26. In the case that the target upper bridge-arm switch module is the fifth switch module P25, the target lower bridge-arm switch module is the second switch module P22 and/or the fourth switch module P24.

It should be noted that the target upper bridge-arm switch module and the target lower bridge-arm switch module that are turned on and off periodically in respective cycles may be the same or different, which is not limited. For example, the driving signal in each of the cycles drives the first switch module P21 and the fourth switch module P24 to be turned on and off. For another example, in a first cycle, the driving signal drives the first switch module P21 and the fourth switch module P24 to be turned on and off; in a second cycle, the driving signal drives the third switch module P23 and the second switch module P22 to be turned on and off; and in a third cycle, the driving signal drives the first switch module P21, the fourth switch module P24, and the sixth switch module P26 to be turned on and off; that is, in different cycles, the target upper bridge-arm switch module and the target lower bridge-arm switch module driven by the driving signal may be different.

By driving the target upper bridge-arm switch module and the target lower bridge-arm switch module through the driving signal to be periodically turned on and off, an alternating current is generated in a circuit formed by the battery P1, the main positive switch K1, the target upper bridge-arm switch module, the motor P3, and the target lower bridge-arm switch module and the main negative switch K2. Particularly, an alternating sine wave current may be generated. That is, the battery P1 is thus charged and discharged alternately.

The target conduction switch includes at least one upper bridge-arm switch unit and at least one lower bridge-arm switch unit, and the at least one upper bridge-arm switch unit and at least one lower bridge-arm switch unit are located at different bridge arms.

In some embodiments, the first target module may include the battery and/or the motor windings.

In the case that the first target module includes the battery, when the first current of the motor windings is modulated into the alternating current, the alternating current can generate heat at the battery, so that the battery can be heated by itself through the alternating current.

In the case that the first target module includes the battery and the motor windings, the first current of the motor windings is modulated into the alternating current, and the alternating current can generate heat at both the battery and the motor windings. By using both the heat generated by the alternating current at the battery and the heat generated at the motor windings to heat the battery, heating efficiency can be further improved.

At S530: when the SOC is less than or equals to the first SOC threshold, a second current flowing into the motor windings is modulated into a direct current, so as to use heat generated by the direct current at the second target module to heat the battery.

In some embodiments, modulation of the current in the motor windings into the direct current may be implemented by a SVPWM algorithm. Specifically, the SVPWM algorithm may be used to generate a corresponding control signal to control the target conduction switch in the inverter to be continuously in a conduction state, so as to modulate the current in the motor windings into the direct current.

It should be noted that when the motor windings are provided with a direct current, a radial electromagnetic force of the motor will be reduced. As the radial electromagnetic force decreases, an eddy current loss of the rotor of the motor is reduced, which leads to a decrease in heat generated by the rotor. Further, the reduction of the eddy current loss of the rotor of the motor due to decrease of the radial electromagnetic force also lead to a decrease in electromagnetic vibration noise. Therefore, when the motor windings are provided with a direct current, heat generated by the rotor of the motor and the electromagnetic vibration noise will be reduced.

In some embodiments, the second target module includes the battery and/or the motor windings.

Since heating of the battery by heat generated from the alternating current has a higher heating efficiency and energy consumption than heating of the battery by heat generated from the direct current, in the control method of the battery heating system according to the embodiments of the present application, the direct current is used to generate heat at the first target module to heat the battery when the SOC of the battery SOC is less than or equals to the first SOC threshold, that is, when power of the battery power is insufficient, so as to reduce power consumption; while the alternating power is used to heat the battery when the SOC is greater than the first SOC threshold, that is, when the power of the battery is sufficient, so as to improve heating efficiency, and thereby both the heating efficiency and the energy consumption are taken into consideration entirely, and flexibility of the battery heating system can be improved.

With regard to feasibility of achieving heating by using the current in the windings, it is specifically explained as follows.

It is found through researches that a direct current output power at the battery side of the entire battery heating system equals to a heating power at the alternating current side. Specifically, it conforms to the following formula:

$$U_{dc}I_1 - I_1^2 R_1 = mI_2^2 R_2 \quad (1)$$

In the formula (1), $U_{dc}$ represents a voltage of the battery, $I_1$ represents a direct busbar current, $R_1$ represents an internal resistance of the battery, m represents the number of phases of the motor (for example, m=3 for a three-phase permanent magnet synchronous motor), $I_2^2$ represents a current at an alternating current side of the motor, and $R_2$ represents a resistance of windings of the stator.

Since the resistance of windings of the stator may be in the order of several to tens of milliohms and the voltage of the battery may be around hundreds of volts, even if the direct busbar current is a small value, the current in the motor windings would be large, and accordingly, heat generated by the windings would be great. Therefore, the heat generated by the windings can be used to heat the battery.

In some embodiments, a specific implementation of S530 may include: controlling a target conduction switch in an inverter to be continuously in a conduction state, so as to modulate the second current into the direct current.

The target conduction switch includes at least one upper bridge-arm switch unit and at least one lower bridge-arm switch unit, and at least one upper bridge-arm switch unit and at least one lower bridge-arm switch unit are located on different bridge arms.

For a feasible implementation of the modulation method, it will be specifically described by reference to FIG. 6 in the embodiments of the present application.

Figure 6:
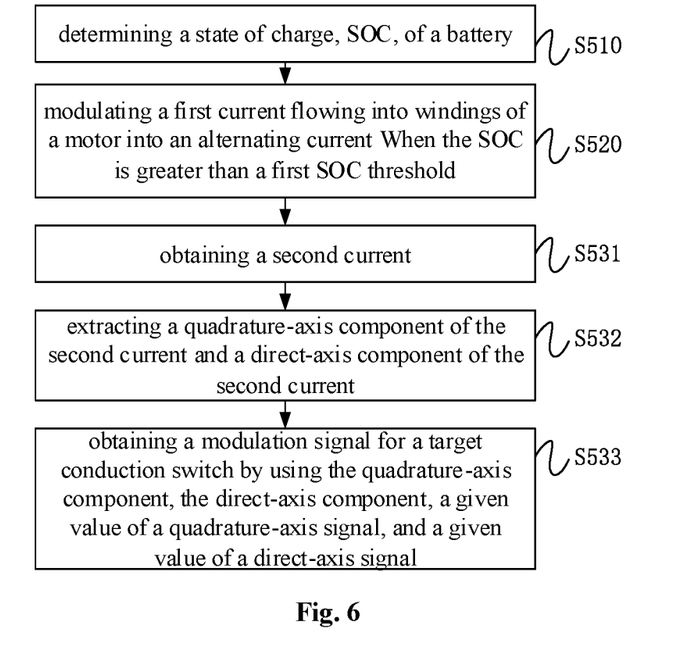
FIG. 6 is a schematic flow chart of an exemplary control method of a battery heating system according to an embodiment of the present application.

In a specific embodiment, FIG. 6 is a schematic flowchart of an exemplary control method of a battery heating system according to an embodiment of the present application.

As shown in FIG. 6, the S530 may be specifically implemented as S531 to S533.

At S531, a second current is obtained. For example, any two phases of currents ia and ib flowing from the inverter to the motor can be sampled from the three phases of connection lines between the inverter and the motor.

At S532, a quadrature-axis component iq of the second current and a direct-axis component id of the second current is extracted.

Specifically, the second current can be converted from a abc coordinate system to a dq coordinate system, and then decomposed in the dq coordinate system to obtain the direct-axis component id of the second current and the quadrature-axis component iq of the second current.

At S533, a modulation signal for the target conduction switch can be obtained from the quadrature-axis component iq, the direct-axis component id, a given value of a quadrature-axis signal $i_q^*$ and a given value of a direct-axis signal $i_d^*$ to obtain.

The given value of the quadrature-axis signal $i_q^*$ is equal to zero. In an embodiment, the given value of the direct-axis signal $i_d^*$ can be set according to specific scenarios and actual requirements, which will not be repeated here. Exemplarily, the given value of the direct-axis signal $i_d^*$ can be determined according to a preset safe current.

In some embodiments, at S533, the modulation signal for the target conduction switch may be obtained by the following method.

Figure 7:
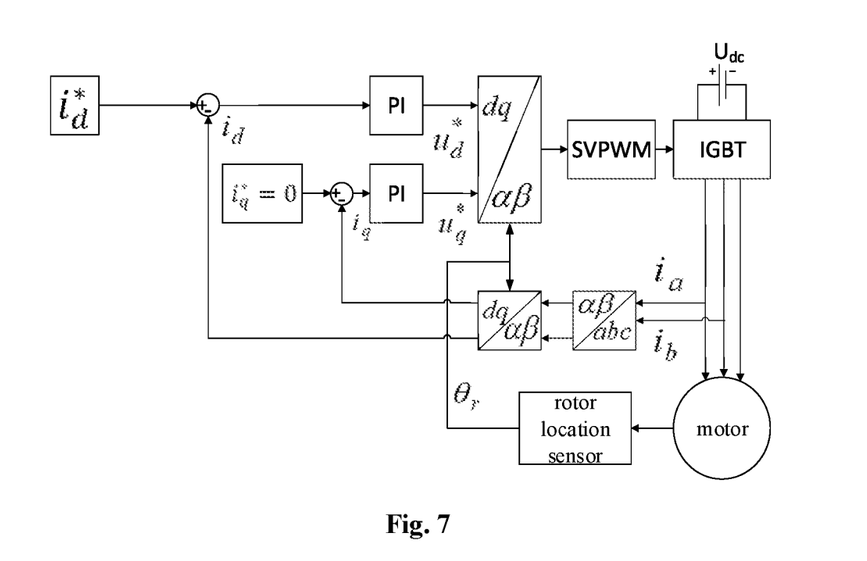
FIG. 7 is a logical flow chart for calculating a modulation signal for a target conduction switch according to an embodiment of the present application.

In order to facilitate understanding of the modulation process, FIG. 7 is a logic flowchart for calculating a modulation signal for a target conduction switch according to an embodiment of the present application.

As shown in FIG. 7, regarding the second current, two phases of currents ia and ib can be obtained, and then converted from a three-phase stationary coordinate system, namely an abc coordinate system, to a two-phase stationary coordinate system, namely an αβcoordinate system. Then, the two-phase stationary coordinate system is converted to a two-phase rotating coordinate system, namely a dq coordinate system, so that the direct-axis component id and the quadrature-axis component iq of the second current can be obtained.

For the quadrature-axis component iq and the given quadrature-axis signal value $i_q^*$, a subtractor can be used to calculate a quadrature-axis signal difference, and then a proportional integral controller (Proportional Integral, PI) can be used to determine the quadrature-axis voltage modulation signal $u_q^*$.

For the direct-axis component id and the given direct-axis signal value $i_d^*$, a subtractor can be used to calculate a direct-axis signal difference, and then a proportional integral controller (Proportional Integral, PI) can be used to determine a direct-axis voltage modulation signal $u_d^*$.

Then, the quadrature-axis voltage modulation signal $u_q^*$ and the direct-axis voltage modulation signal $u_d^*$ are converted them from the $\alpha\beta$ coordinate system to the abc coordinate system, and a resulted voltage modulation signal is inputted into a SVPWM unit to obtain the modulation signal for the switch units in the inverter. Exemplarily, the switch unit in the inverter may be particularly implemented as an insulated gate bipolar transistor (IGBT). It should be noted that the switch unit in the inverter may be a switch unit of another type, for example, it may be implemented as at least one of a triode and a Metal-Oxide-Semiconductor Field-Effect Transistor (MOSFET), etc. There is no limitation on the type of the switch unit.

In some embodiments, S530, in addition to be implemented to control the target conduction switch to be continuously in a conduction state, may further include:

adjust an angle between a stator magnetic field of the motor and a rotor magnetic field of the motor to zero.

With the embodiment, the radial electromagnetic force can be further reduced, thereby reducing the amount of heat generated by the rotor of the motor and the electromagnetic vibration noise.

Specifically, for feasibility of the method, the following discussion is provided.

When the busbar current is supplied with a direct current, the windings of the stator are also supplied with the direct current, and accordingly, the windings of the stator generate a stable magnetic field. At the point, through controlling of the angle between the magnetic field of the stator and the magnetic field of the rotor to be 0, the motor will not generate a torque. At the point, an eddy current loss generated by the magnetic field of the stator on the rotor can be expressed by the following formula (2):

$$P_c = K_c f^2 B_S^2 \quad (2)$$

where $P_c$ represents an eddy current loss of the rotor, $K_c$ represents a classical eddy current loss coefficient, f represents a power supply frequency, and $B_S$ represents an amplitude of a magnetic flux density of the stator. Since the windings of the stator are provided with a direct current, no eddy current loss is generated at the rotor in this case. Considering influence of other factors, the amount of heat generated at the rotor is small, and accordingly, the heat generated at the rotor of the motor is reduced.

In addition, when the stator is supplied with a three-phase alternating current, the radial electromagnetic force fr satisfies the following formula (3):

$$f_r = \frac{1}{2\mu_0}(B_S + B_R)^2 \quad (3)$$

In the formula (3), $\mu_0$ represents an air permeability, the flux density BS of the stator and the flux density BR of the rotor can be expressed as the following formula (4) and formula (5) respectively:

$$B_S = F_1(\alpha,t)\Lambda_g \quad (4)$$

$$B_R = F_2(\alpha,t)\Lambda_g \quad (5)$$

In formula (4) and formula (5), $\Lambda_g$ represents an equivalent air-gap permeance, $F_1$ represents a magnetomotive force generated by symmetric three-phases of windings of the stator, and $F_2$ represents a magnetomotive force generated by permanent magnets of the rotor. Particularly, $F_1$ and $F_2$ are respectively expressed as the following formulas (6) and (7):

$$F_1(\alpha, t) = \sum_{\nu=1}^{\infty} F_{m\nu} \cos(\nu p\alpha - \omega t) \quad (6)$$

$$F_2(\alpha, t) = \sum_{\mu=1}^{\infty} F_{m\mu} \cos(\mu p\alpha - \omega_\mu t + \phi_\mu) \quad (7)$$

In formula (6) and formula (7), ν represents a harmonic order of the stator, ω represents an energization frequency of the windings (when the windings are supplied with a direct current, ω is 0), μ represents a harmonic order of the rotor, and Fmν represents an amplitude of a magnetomotive force of a $\nu^{th}$ harmonic of the stator, Fmμ, represents an amplitude of a magnetomotive force of a $\nu^{th}$ harmonic of the rotor, ωμ represents an electrical angular frequency of a magnetomotive force of a $\mu^{th}$ harmonic of the rotor (under the battery heating control strategy, μ is 0), and φμ represents an angle between the magnetomotive force of a $\mu^{th}$-harmonic and an initial position of the rotor.

Particularly, substituting the formulas (4) to (7) into the formula (3), it is found that since both a rotational angular velocity of a magnetic field of the stator and a rotational angular velocity of a magnetic field of the rotor are 0, a generation frequency for a radial electromagnetic force is only related to the harmonic order, and the radial electromagnetic force caused by the energizing frequency has been eliminated, so that vibration noise of the motor is also significantly reduced in such case.

After verifying feasibility of the above solution, a modulation scheme of an angle between a magnetic field of the stator of the motor and a magnetic field of the rotor of the motor will be discussed in detail.

Particularly, a modulation scheme of an angle between a magnetic field of the stator of the motor and a magnetic field of the rotor of the motor may specifically include the following steps A and B.

At Step A: an angle of a magnetic field of the rotor of the motor is obtained.

In an embodiment, the angle of a magnetic field of the rotor of the motor may be obtained by a rotor location sensor. For example, continue to refer to FIG. 7, the angle$\theta_r$ of the magnetic field of the rotor of the motor is obtained by the rotor location sensor.

At Step B, an angle of a magnetic field of the stator of the motor is calculated according to the direct-axis component, and the angle of a magnetic field of the rotor of the motor and the angle of the magnetic field of the stator of the motor are adjusted to be a same angle.

Particularly, adjustment of the angle of a magnetic field of the rotor of the motor and the angle of the magnetic field of the stator of the motor to be the same angle may be made by adjusting a given value of the direct-axis component.

In some embodiments, in order to further improve heating safety, the control method may further includes: controlling a value of a current intensity of the direct current not to exceed a preset safe current.

The preset safe current is a current that characterizes that each of components of the battery heating system does not have a safety risk. Specifically, it may be a current that characterizes that there is no risk of thermal runaway in each of the components of the battery heating system. For example, when the value of the current intensity of the direct current equals to the preset safe current, a temperature of the target conduction switch is not greater than a preset upper temperature limit, and a temperature of the motor windings is not greater than a preset insulation temperature.

In an embodiment, adjustment of the direct current not to exceed the preset safe current may be made by adjusting a given value of the direct-axis component.

A calculation formula for a temperature TCu of the motor windings may be estimated according to the following formula (8):

$$T_{Cu} = \frac{I_2^2 R_2 \cdot \Delta t}{C_{Cu} M_{Cu}} + T_0 \tag{8}$$

In the formula (8), CCu represents a specific heat capacity of the windings of the stator, MCu represents quality of one phase of winding, $\Delta t$ represents a time period for energizing the windings, and T0 represents an ambient temperature.

Figure 8:
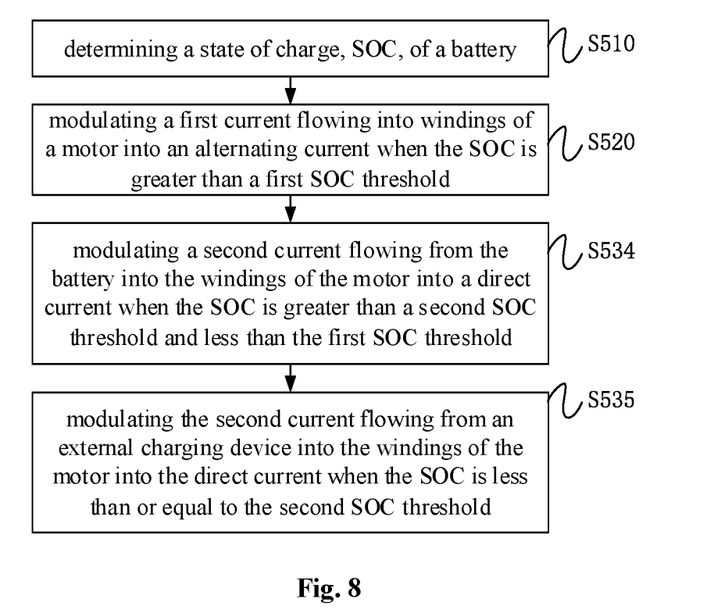
FIG. 8 is a schematic flow chart of another control method of a battery heating system according to an embodiment of the present application.

In order to further improve flexibility of the battery heating system, the embodiments of the present application provides yet another control method of a battery heating system. FIG. 8 is a schematic flowchart of yet another control method of a battery heating system according to an embodiment of the present application. The difference between FIG. 8 and FIG. 5 is that the control method in FIG. 8 may further include steps S534 and S535.

At S534: when the SOC is greater than the second SOC threshold and less than or equals to the first SOC threshold, the second current flowing from the battery into the motor windings is modulated into the direct current. The second SOC threshold may be set according to specific scenarios and actual requirements, for example, it may be, but not limited to, 10%, or a value close to 10%.

At S535: when the SOC is less than or equals to the second SOC threshold, the second current flowing from an external charging device into the motor windings is modulated into the direct current.

In some embodiments, the external charging device may be, but not limited to, a fixed charging pile, a vehicle-mounted charging device, etc.

In a specific implementation process, after a charging gun of the external charging device is inserted into a charging interface, a magnitude relationship of the SOC and the second SOC threshold can be determined, and then an appropriate second current output source can be selected from the battery and the external charging device.

Based on the same application concept, in addition to providing a control method of a battery heating system, the embodiments of the present application also provide a corresponding control device of a battery heating system.

A control device of a battery heating system according to an embodiment of the present application will be described in detail with reference to the accompanying drawings as follows.

Figure 9:
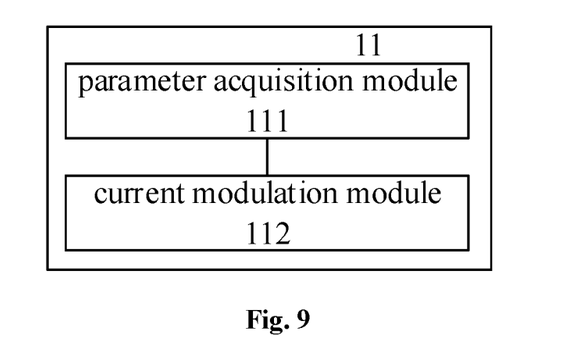
FIG. 9 is a schematic structural diagram of a control device of a battery heating system according to an embodiment of the present application.

FIG. 9 is a schematic structural diagram of a control device of a battery heating system according to an embodiment of the present application. As shown in FIG. 9, a control device 11 of a battery heating system includes a parameter acquisition module 111 and a current modulation module 112.

The parameter acquisition module 111 is configured to determine a state of charge, SOC, of a battery.

The current modulation module 112 is configured to modulate a first current flowing into motor windings into an alternating current when the SOC is greater than a first SOC threshold, so as to use heat generated by the alternating current at the motor windings to heat the battery.

Further, the current modulation module 112 is also configured to modulate a second current flowing into the motor windings into a direct current when the SOC is less than or equals to the first SOC threshold, so as to use heat generated by the direct current at the motor windings to heat the battery.

The inverter is connected to the motor windings, and the target conduction switch includes at least one upper bridge-arm switch unit and at least one lower bridge-arm switch unit, and the at least one upper bridge-arm switch unit and at least one lower bridge-arm switch unit are located on different bridge arms.

In some embodiments of the present application, the current modulation module 112 is specifically configured to:

modulate the second current flowing from the battery into the motor windings into the direct current when the SOC is greater than the second SOC threshold and less than or equals to the first SOC threshold; and modulate the second current flowing from the external charging device into the motor windings into direct current when the SOC is less than or equals to the second SOC threshold.

In some embodiments of the present application, the current modulation module 112 is specifically configured to:

control the target conduction switch in the inverter to be continuously in a conduction state, so as to modulate the second current into the direct current.

In some embodiments of the present application, the current modulation module 112 is specifically configured to:

adjust an angle between a stator magnetic field of the motor and a rotor magnetic field of the motor to zero.

In some embodiments of the present application, the current modulation module 112 is further configured to:

the control module is configured to control a value of a current intensity of the direct current not to exceed a preset safe current.

When the value of the current intensity of the direct current equals to the preset safe current, a temperature of the target conduction switch is not greater than a preset upper temperature limit, and a temperature of the motor windings is not greater than a preset insulation temperature.

In some embodiments of the present application, the current modulation module 112 is further configured to:

obtain the second current; extract a quadrature-axis component of the second current and a direct-axis component of the second current; and determine a modulation signal for the target conduction switch by using the quadrature-axis component, the direct-axis component, a given value of a quadrature-axis signal, and a given value of a direct-axis signal.

The given value of the quadrature-axis signal equals to 0, and the given value of the direct-axis signal is determined according to a preset safe current.

In some embodiments of the present application, the current modulation module 112 is further configured to:

obtain an angle of a rotor magnetic field of the motor; calculate an angle of a stator magnetic field of the motor based on the direct-axis component; and adjust the angle of the rotor magnetic field of the motor and the angle of the rotor magnetic field of the motor to be a same angle.

The other details of the control device of the battery heating system according to the embodiment of the present application are similar to those for the control method of the battery heating system described above with reference to the examples shown in FIGS. 5 to 8, and corresponding technical effects can be achieved. They are not repeated here in order for concise description.

It should be noted that the various embodiments in the present description are described in a progressive manner, and the same or similar parts between the various embodiments can be referred to each other. Each embodiment focuses on description of differences from the other embodiments. The method embodiment is described in a relatively simple manner, but related details thereof may be obtained by reference to those descriptions of the system embodiment. The present application is not limited to the specific steps and structures described above and shown in the figures. It is possible for those skilled in the art to make various changes, modifications and additions or change the order between the steps after grasping a principle of the present application. For sake of brevity, a detailed description of known methods and technologies is omitted here.

The functional modules in the foregoing embodiments may be implemented as a hardware, software, firmware, or a combination thereof. When implemented in hardware, it may be, for example, an electronic circuit, an application specific integrated circuit (ASIC), appropriate firmware, a plug-in, a function card, and so on. When implemented in software, the elements of the present application may be programs or code segments used to perform required tasks. The program or code segments may be stored in a machine-readable medium, or transmitted on a transmission medium or a communication link through a data signal carried in a carrier wave. "Machine-readable medium" may include any medium that can store or transmit information.

Although the present application has been described with reference to preferred embodiments, various improvements can be made and the components therein can be replaced with their equivalents without departing from a scope of the present application. In particular, as long as there is no structural conflict, the various technical features mentioned in the various embodiments can be combined in any manner. The present application is not limited to the specific embodiments disclosed in the description, but cover all technical solutions falling within the scope of the claims.

What is claimed is:

1. A control method of a battery heating system, the battery heating system comprising windings of a motor and a control device coupled with the windings of the motor, wherein and the control method is applied in the control device and comprises:
acquiring a state of charge (SOC) of a battery that supplies power to the motor;
determining whether the SOC of the battery is greater than a first SOC threshold;
modulating a first current flowing into the windings of the motor into an alternating current in the case that the SOC of the battery is greater than the first SOC threshold, so as to use heat generated by the alternating current flowing through at least one of the battery and the windings of the motor to heat the battery; and
modulating a second current flowing into the windings of the motor into a direct current in the case that the SOC of the battery is less than or equals to the first SOC threshold, so as to use heat generated by the direct current flowing through at least one of the battery and the windings of the motor to heat the battery,
wherein the modulation of the second current flowing into the windings of the motor into the direct current comprises:
controlling a target conduction switch in an inverter to be continuously in a conduction state, so as to modulate the second current into the direct current; and
wherein the controlling of the target conduction switch in the inverter to be continuously in the conduction state comprises:
obtaining the second current; extracting a quadrature-axis component of the second current and a direct-axis component of the second current; and
obtaining a modulation signal for the target conduction switch by using the quadrature-axis component, the direct-axis component, a given value of a quadrature-axis signal, and a given value of a direct-axis signal;
wherein the given value of the quadrature-axis signal is equal to 0, and the given value of the direct-axis signal is determined according to a preset safe current.

2. The control method of the battery heating system according to claim 1, wherein the modulation of the second current flowing into the windings of the motor into the direct current when the SOC of the battery is less than or equal to the first SOC threshold particularly comprises:
modulating the second current flowing from the battery into the windings of the motor into the direct current when the SOC of the battery is greater than a second SOC threshold and less than the first SOC threshold; and
modulating the second current flowing from an external charging device into the windings of the motor into the direct current when the SOC of the battery is less than or equal to the second SOC threshold.

3. The control method of the battery heating system according to claim 1,
wherein the inverter is connected to the windings of the motor, and wherein the target conduction switch comprises at least one upper bridge-arm switch unit and at least one lower bridge-arm switch unit, and the at least one upper bridge-arm switch unit and the at least one lower bridge-arm switch unit are located on different bridge-arms.

4. The control method of the battery heating system according to claim 3, wherein the modulation of the second current flowing into the windings of the motor into the direct current further comprises:
adjusting an angle between a stator magnetic field of the motor and a rotor magnetic field of the motor to zero.

5. The control method of the battery heating system according to claim 3, wherein the control method further comprises:
controlling a value of a current intensity of the direct current not to exceed a preset safe current;
wherein when the value of the current intensity of the direct current is equal to the preset safe current, temperature of the target conduction switch is not greater than a preset upper temperature limit, and temperature of the windings of the motor is not greater than a preset insulation temperature.

6. The control method of the battery heating system according to claim 3, wherein the control method further comprises:
obtaining an angle of a rotor magnetic field of the motor;
calculating an angle of a stator magnetic field of the motor according to the direct-axis component, and adjusting the angle of the stator magnetic field of the motor and the angle of the rotor magnetic field of the motor to be a same angle.

7. A computer-readable storage medium storing instructions thereon, which, when executed by a processor, cause the processor to perform the control method according to claim 1.

8. A current modulation module, comprising:
a memory for storing instructions; and
a processor for performing the instructions stored in the memory to:

acquire a state of charge (SOC), of a battery that supplies power to a motor;

determine whether the state of charge (SOC) of the battery is greater than a first SOC threshold;

modulate a first current flowing into windings of the motor into an alternating current in the case that the SOC of the battery is greater than the first SOC threshold, so as to use heat generated by the alternating current flowing through at least one of the battery and the windings of the motor to heat the battery; and modulate a second current flowing into the windings of the motor into a direct current in the case that the SOC of the battery is less than or equals to the first SOC threshold, so as to use heat generated by the direct current flowing through at least one of the battery and the windings of the motor to heat the battery, wherein the processor is further configured to:

control a target conduction switch in an inverter to be continuously in a conduction state, so as to modulate the second current into the direct current; and wherein the processor is further configured to:

obtain the second current;

extract a quadrature-axis component of the second current and a direct-axis component of the second current; and obtain a modulation signal for the target conduction switch by using the quadrature-axis component, the direct-axis component, a given value of a quadrature-axis signal, and a given value of a direct-axis signal;

wherein the given value of the quadrature-axis signal is equal to 0, and the given value of the direct-axis signal is determined according to a preset safe current.

9. The current modulation module according to claim 8, wherein the current modulation module is a controller for the motor.

10. The current modulation module according to claim 8, wherein the processor is further configured to:

modulate the second current flowing from the battery into the windings of the motor into the direct current when the SOC of the battery is greater than a second SOC threshold and less than the first SOC threshold; and modulate the second current flowing from an external charging device into the windings of the motor into the direct current when the SOC of the battery is less than or equal to the second SOC threshold.

11. The current modulation module according to claim 8, wherein the inverter is connected to the windings of the motor, and wherein the target conduction switch comprises at least one upper bridge-arm switch unit and at least one lower bridge-arm switch unit, and the at least one upper bridge-arm switch unit and the at least one lower bridge-arm switch unit are located on different bridge-arms.

12. The current modulation module according to claim 11, wherein the processor is further configured to:

adjust an angle between a stator magnetic field of the motor and a rotor magnetic field of the motor to zero.

13. The current modulation module according to claim 11, wherein the processor is further configured to:

control a value of a current intensity of the direct current not to exceed a preset safe current;

wherein when the value of the current intensity of the direct current is equal to the preset safe current, temperature of the target conduction switch is not greater than a preset upper temperature limit, and temperature of the windings of the motor is not greater than a preset insulation temperature.

14. The current modulation module according to claim 11, wherein the processor is further configured to:

obtain an angle of a rotor magnetic field of the motor;

calculate an angle of a stator magnetic field of the motor according to the direct-axis component, and adjusting the angle of the stator magnetic field of the motor and the angle of the rotor magnetic field of the motor to be a same angle.

* * * * *